United States Patent
Yun et al.

(10) Patent No.: US 7,343,215 B2
(45) Date of Patent: Mar. 11, 2008

(54) METHOTHOLOGY FOR ESTIMATING STATISTICAL DISTRIBUTION CHARACTERISTICS OF PRODUCT PARAMETERS

(75) Inventors: Sung-Hee Yun, Suwon-si (KR); Seung-Ho Jung, Suwon-si (KR); Dae-Wook Kim, Seoul (KR); Moon-Hyun Yoo, Suwon-si (KR); Jong-Bae Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/656,715

(22) Filed: Jan. 23, 2007

(65) Prior Publication Data

US 2007/0174030 A1 Jul. 26, 2007

(30) Foreign Application Priority Data

Jan. 23, 2006 (KR) .................... 10-2006-0006873

(51) Int. Cl.
    G06F 19/00 (2006.01)
(52) U.S. Cl. ................................... 700/117
(58) Field of Classification Search ................ 700/95, 700/96, 104, 109, 117
    See application file for complete search history.

(56) References Cited

U.S. PATENT DOCUMENTS 6,912,437 B2    6/2005   Chong et al.
2003/0120372 A1*  6/2003  Ruth et al. ................. 700/108
2004/0040001 A1   2/2004  Miller et al.
2005/0010308 A1*  1/2005  Bennett ..................... 700/28
2006/0217910 A1*  9/2006  Wang ........................ 702/84
2006/0247894 A1* 11/2006  Wang et al. ............... 702/179

FOREIGN PATENT DOCUMENTS

| JP | 2003-297892 | 10/2003 |
| KR | 20030078636 A | 10/2003 |
| KR | 20050055729 | 6/2005 |
| KR | 20050058369 | 6/2005 |

* cited by examiner

*Primary Examiner*—Leo Picard
*Assistant Examiner*—Chad Rapp
(74) *Attorney, Agent, or Firm*—Mills & Onello LLP

(57) ABSTRACT

Disclosed is method for estimating statistical distribution characteristics of product parameters. The method comprises determining n number of product parameters, which characterize a product, and m number of characteristic parameters dependent on the product parameters, determining m number of correlation functions that represent the characteristic parameters in terms of the product parameters, and obtaining inverse functions of the correlation functions that represent the product parameters in terms of the characteristic parameters. After fabricating test products to empirically determine quantitative relations between the product and characteristic parameters, the method includes measuring k number of test products and preparing measured data of the characteristic parameters. Thereafter, the method includes estimating statistical characteristics of the product parameters corresponding with a distribution of the measured data of the characteristic parameters using inverse functions of the correlation functions.

35 Claims, 10 Drawing Sheets

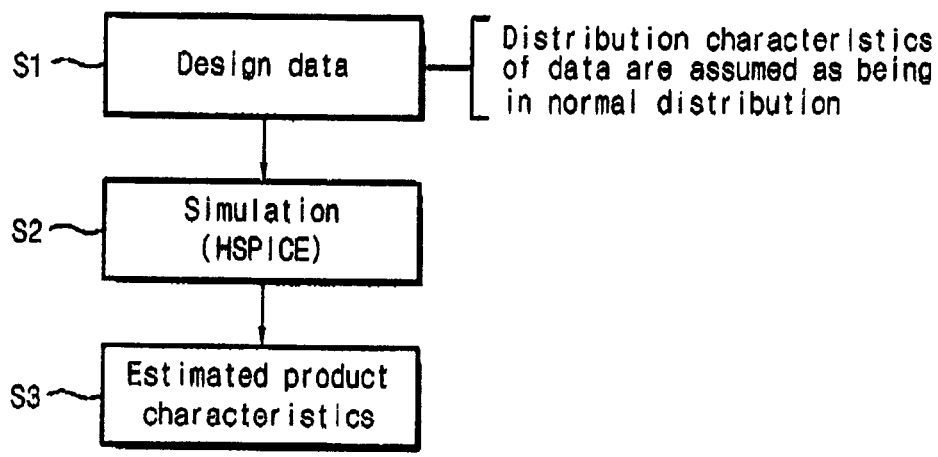
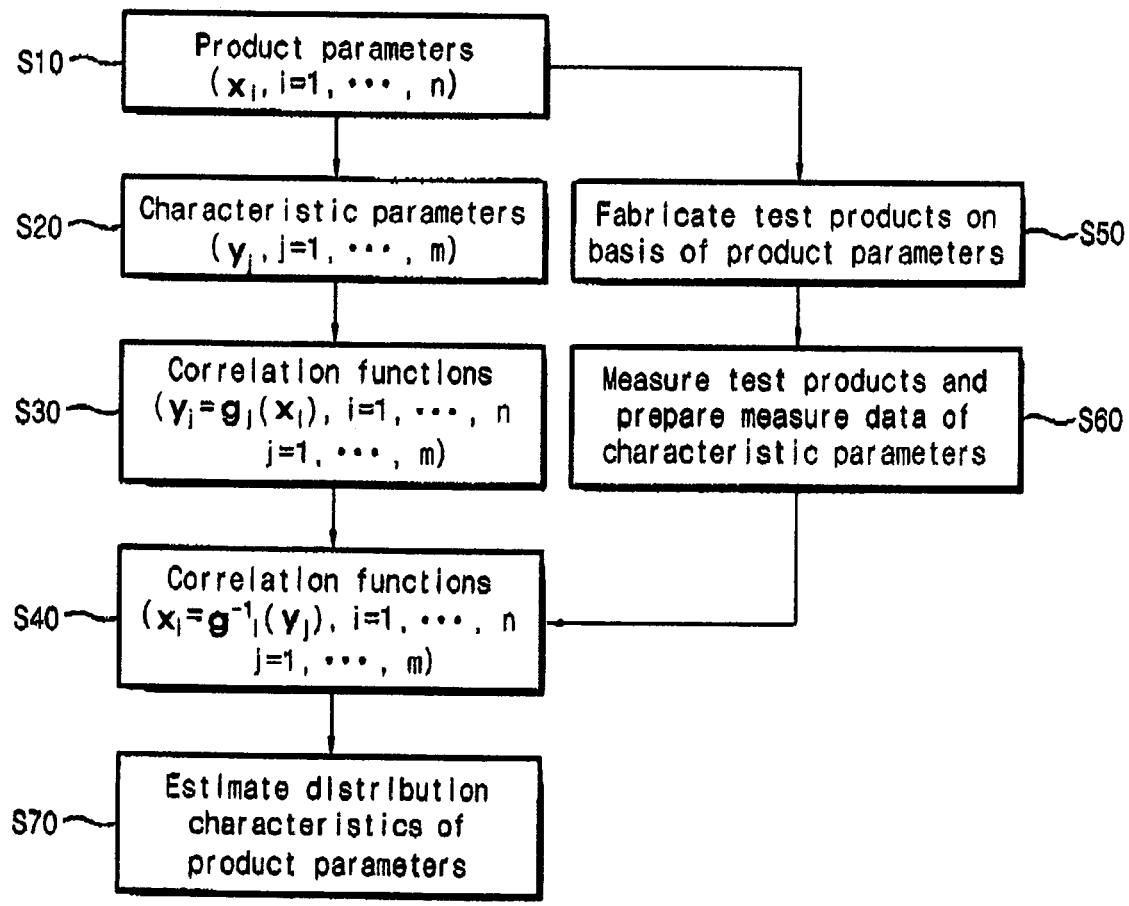

METHOTHOLOGY FOR ESTIMATING STATISTICAL DISTRIBUTION CHARACTERISTICS OF PRODUCT PARAMETERS

CROSS-REFERENCE TO RELATED APPLICATIONS

This U.S. non-provisional patent application claims priority under 35 U.S.C. § 119 to Korean Patent Application No. 10-2006-0006873 filed on Jan. 23, 2006 in the Korean Intellectual Property Office, the entire contents of which are hereby incorporated by reference.

BACKGROUND

The present invention disclosed herein relates to methods for estimating statistical distribution characteristics of parameters used in developing products.

Qualities of products are basically dependent on design rules and processing conditions applied in designing and manufacturing of the products. With evolution of science and technology, procedures for designing and manufacturing industrial products have become more complicated. As a result, it is more difficult to analyze dependence of product quality relative to design rules and processing conditions. Considering that the accuracy and rapidity of such analysis operations contributes to shortening time-to-market for new products, it is necessary to analyze, correctly and rapidly, correlations among the design rules, the processing conditions, and the product qualities.

In further detail, manufacture of semiconductor integrated circuit by high technology processes is a typical one having complexity of design and fabrication process and difficulty in analyzing correlations according thereto. Usually, a manufacturer fabricates a semiconductor integrated circuit with reference to a specification defining required standards on electrical and structural characteristics. In the beginning of the semiconductor industry, circuit design verification according to the specification was conducted directly by a person, but now a computer system takes on the function of circuit design verification. Applying a computer system having an excellent computing power to the prior case had been quite successful. However, an operation speed and accuracy of the circuit design verification has been remarkably degraded as the integration density of semiconductor circuit has increased.

Further, as semiconductor devices become smaller in dimensions, a relative ratio of processing variations, which results from procedures of manufacturing such semiconductor devices, is increased. That is, if highly and lowly integrated semiconductor devices have a processing error of the same size, the highly integrated semiconductor device has the increased ratio of the size of processing error to the reference size or dimensions, compared with the lowly integrated semiconductor device. Therefore, in a procedure of designing a semiconductor integrated circuit, there is a rising need of considering even variations on manufacturing processes. Since variations in manufacturing processes affect a yield of a semiconductor device, it is important to estimate fluctuations on electrical characteristics of products according to the variations on manufacturing processes.

In detail, considering that electrical characteristics of semiconductor devices are subject to morphological/physical parameters (hereinafter, referred to as independent parameters) such as channel length (L), device width (W), doping profile (Na or Nd), oxide thickness ($T_{ox}$), oxide permittivity ($\epsilon_{ox}$), and channel length modulation constant ($\lambda$), it is necessary to estimate statistical distributions of the independent parameters in order to enhance yields of the semiconductor devices. In a prior approach, as shown in FIG. 1, a predetermined process of simulation (S2) was carried out for estimating product characteristics. The process of simulation used input data with design data (i.e., the independent parameters) that was assumed to have normal distribution (S1). However, the normal distribution assumed for input data can be improper because of complicated reasons, such as the aforementioned variations on process. Incorrect input data results in inaccurate estimation to product characteristics, so it is insufficient to obtain a desired result just by assuming the distribution characteristics of design data, which are used as the input data, as being arranged in normal distribution profile. Thus, it is required to correctly estimate the product characteristics.

Nevertheless, it is generally not easy to estimate statistical distribution of the independent parameters. For instance, physical theories can be utilized to derive an equation defining correlations between the independent parameters and the dependent electrical characteristics, but those theoretical approaches are regarded as being successful only in very restrictive cases. In other words, as general cases, those equations are kinds of multi-variable functions. Further, since parameters of the equations are dependent on processing conditions (continuously updated for improving yields), it is mostly difficult to derive the equations through such theoretical approaches in practice. As a result, it is hard for the prior approach to obtain proper estimation results of statistical distribution characteristics for the independent parameters.

In other approaches to relieve such aforementioned difficulty, there are methods of estimating statistical distribution characteristics for the independent parameters by means of a model fitting process that needs a long arithmetic procedure. However, as those methods are based on the model fitting technique, they do not provide physical significance for correlations between the independent parameters and the electrical characteristics subject to the independent parameters, as well as taking a very long time to execute.

SUMMARY OF THE INVENTION

According to aspects of the present invention, provided is a method for analyzing, correctly and rapidly, a correlation between independent parameters that characterize a product, and parameters subject to the independent parameters.

According to aspects of the present invention, also provided is a method of estimating statistical distribution characteristics, capable of offering understanding about physical correlations between independent and dependent parameters.

In accordance with one aspect of the present invention, provided is a method for estimating distribution characteristics of product parameters. This method comprises determining n number of product parameters that characterize a product, determining m number of characteristic parameters dependent on the product parameters, determining c m number of correlation functions that represent the characteristic parameters in terms of the product parameters, and obtaining inverse functions of the correlation functions that represent the product parameters in terms of the characteristic parameters. The method further includes fabricating test products to empirically determine quantitative relations between the product parameters and characteristic parameters, in number of k, obtaining k numbered measured data of the characteristic parameters by measuring k number of the test products. The method further includes estimating statistical characteristics of the product parameters corresponding to a distribution of the measured data of the characteristic parameters using inverse functions of the correlation functions.

The product parameters can be physical parameters representing physical characteristics of the products, processing conditions for fabricating the products, or both, and the characteristic parameters are measurable parameters can be dependent on the product parameters.

The correlation functions can be determined using at least one of physical/chemical theories, a simulation technique, and a modeling technique based on empirical data.

Determining the correlation functions can comprise: determining design values of the characteristic parameters and product parameters for satisfying required qualities of the product; and obtaining the correlation functions to fit the design values of the characteristic parameters and the design values of the product parameters.

Determining the correlation functions can comprise: selecting different input values in a predetermined number around the design values of the product parameters; extracting values of the characteristic parameters corresponding to the selected input values as output data, by conducting simulation using the selected input values as input data; and conducting a model fitting operation to determine the correlation functions representing the quantitative relations between the selected input values and the values of the characteristic parameters extracted as the output data.

Selecting the input values can comprise utilizing at least one design of experiment (DOE) technique comprising D-optimal design, full factorial design, fractional factorial design, central composite design, and Box-Behnken design.

The model fitting operation can comprise using a response surface modeling (RSM) technique.

Obtaining the inverse functions of the correlation functions can comprise: obtaining a Jacobian matrix represented as partial derivatives of the product parameters relative to the characteristic parameters; obtaining a pseudo-inverse matrix of the Jacobian matrix; and obtaining the inverse functions of the correlation functions that represent the product parameters by transforming the product parameters into the characteristic parameters using the pseudo-inverse matrix of the Jacobian matrix.

Estimating the statistical characteristics of the product parameters comprises: obtaining k number of estimated product parameters by substituting the k-numbered measured data of the characteristic of the product parameters into the following equation: $x=x_0+IJ(y-y_0)$, where x denotes a matrix of the product parameters; $x_0$ denotes a matrix of the design values of the product parameters; $y_0$ denotes a matrix of the design values of the characteristic parameters; y denotes a matrix of the characteristic parameters; and IJ denotes an inverse matrix of the Jacobian matrix.

Estimating the statistical characteristics of the product parameters can comprise: extracting distribution data of the product parameters corresponding to the measured data by applying the measured data of the characteristic parameters into the inverse functions of the correlation functions; and extracting statistical distribution characteristics, which comprise mean values, dispersions, and standard deviations, of the product parameters, from the extracted distribution data of the product parameters.

After extracting the statistical distribution characteristics of the product parameters, the method can further comprise: conducting a simulation using the statistical distribution characteristics of the product parameters as input data to estimate characteristics of the product, wherein the statistical distribution characteristics of the product parameters are obtained from the measured data of the characteristic parameters.

In accordance with another aspect of the present invention, provided is a method for estimating physical parameters of a semiconductor device. The method comprises: determining n number of physical parameters to characterize the semiconductor device; determining m number of electrical parameters dependent on the physical parameters; determining m number of correlation functions that represent the electrical parameters in terms of the physical parameters; obtaining inverse functions of the correlation functions that represent the physical parameters in terms of the electrical parameters; fabricating test devices to empirically determine quantitative relations between the physical parameters and electrical parameters; obtaining k numbered measured data of the electrical parameters by measuring k number of the test devices; and estimating statistical characteristics of the physical parameters corresponding to a distribution of the measured data of the electrical parameters using the inverse functions of the correlation functions.

The semiconductor device can comprise at least one or transistors, resistive elements, interconnections coupling the transistors and/or resistive elements, and insulating constructions disposed around the transistors, the resistive elements, and the interconnections, wherein the physical parameters are parameters representing physical characteristics of at least one of the transistors, the resistive elements, the interconnections, and the insulating constructions, wherein the electrical parameters are parameters electrically measurable and dependent on the physical parameters.

The physical parameters can comprise at least one physical characteristic of the transistor comprising channel length, channel width, thickness of gate insulation film, thickness of gate electrode, impurity concentration of gate electrode, conductance of gate electrode, impurity concentration of channel, depth of source/drain region, and zero-bias threshold voltage, and wherein the electrical parameters comprises at least one electrical characteristic of the transistor comprising source/drain current, off-current, threshold voltage, breakdown voltage of gate insulation film, breakdown voltage of source/drain junction, and punch-through voltage.

The correlation functions can be determined using at least one of physical/chemical theories, a simulation technique, and a modeling technique based on empirical data.

Determining the correlation functions can comprise: determining design values of the electrical parameters and physical parameters for satisfying required qualities of the semiconductor device; and obtaining the correlation functions to fit the design values of the electrical parameters and the design values of the physical parameters.

Determining the correlation functions comprise: selecting different input values in a predetermined number around the design values of the physical parameters; extracting values of the electrical parameters corresponding to the selected input values as output data, by conducting simulation using the selected input values as input data; and conducting a model fitting operation to determine the correlation functions representing the quantitative relations between the selected input values and the values of the electrical parameters extracted as the output data.

Selecting the input values can comprise utilizing at least one design of experiment (DOE) technique comprising D-optimal design, full factorial design, fractional factorial design, central composite design, and Box-Behnken design.

The model fitting operation can comprise using a response surface modeling (RSM) technique.

Obtaining the inverse functions of the correlation functions comprise: obtaining a Jacobian matrix represented as partial derivatives of the physical parameters relative to the electrical parameters; obtaining a pseudo-inverse matrix of the Jacobian matrix; and obtaining the inverse functions of the correlation functions that represent the physical parameters by transforming the product parameters into the electrical parameters using the pseudo-inverse matrix of the Jacobian matrix.

Estimating the statistical characteristics of the physical parameters can comprise: obtaining k-numbered estimated physical parameters by substituting the k-numbered measured data of the electrical parameters into the following equation: $x=x_0+IJ(y-y_0)$, where x denotes a matrix of the physical parameters; $x_0$ denote a matrix of the design values of the physical parameters; $y_0$ denote a matrix of the design values of the electrical parameters; y denotes a matrix of the electrical parameters; and IJ denotes an inverse matrix of the Jacobian matrix.

Estimating the statistical characteristics of the physical parameters can comprise: extracting distribution data of the physical parameters, in correspondence with the measured data, by substituting the measured data of the electrical parameters into the inverse functions of the correlation functions; and extracting statistical distribution characteristics, which comprise mean values, dispersions, and standard deviations, of the physical parameters, from the extracted distribution data of the physical parameters.

Extracting the statistical distribution characteristics of the physical parameters, the method can further comprise: conducting a simulation using the statistical distribution characteristics of the physical parameters as input data to estimate characteristics of the semiconductor device, wherein the statistical distribution characteristics of the physical parameters are obtained from the measure data of the electrical parameters.

In accordance with another aspect of the invention, provided is a method for estimating processing parameters of a semiconductor device. The method comprises: determining n number of the processing parameters to characterize a fabrication process of the semiconductor device; determining m number of characteristic parameters dependent on the processing parameters; determining m number of correlation functions that represent the characteristic parameters in terms of the processing parameters; obtaining inverse functions of the correlation functions that represent the processing parameters in terms of the characteristic parameters; manufacturing test devices to empirically determine quantitative relations between the processing parameters and characteristic parameters; obtaining k numbered measured data of the characteristic parameters by measuring k number of the test devices; and estimating statistical characteristics of the processing parameters corresponding to a distribution of the measured data of the characteristic parameters using inverse functions of the correlation functions.

Processing parameters can be processing conditions applied in the semiconductor fabrication process, wherein the characteristic parameters are measurable characteristics dependent on the processing conditions.

The semiconductor device can comprise one or more of transistors, resistive elements, interconnections coupling the transistors and/or resistive elements, and insulating constructions disposed around the transistors, the resistive elements, and the interconnections, wherein the processing parameters include at least one of the processing conditions comprising temperature, duration, pressure, gas flux, and relative compound ratio of processing gases, which are applied to at least one of steps for fabricating the transistors, the resistive elements, the interconnections, and the insulative constructions, wherein the characteristic parameters include at least one of characteristics of the semiconductor device fabricated with reference to the processing parameters comprising film thickness, film density, film permittivity, film conductivity, pattern width, tilt angle of pattern sidewall, etching selection ratio, etching rate, deposition rate, and step coverage, which is dependent on the processing conditions.

The correlation functions can be determined using at least of physical/chemical theories, a simulation technique, and a modeling technique based on empirical data.

Determining the correlation functions can comprise: determining design values of the characteristic parameters and processing parameters for satisfying required qualities of the semiconductor device; and obtaining the correlation functions to fit the design values of the characteristic parameters and the design values of the processing parameters.

Determining the correlation functions can comprise: selecting different input values in a predetermined number around the design values of the processing parameters; extracting values of the characteristic parameters corresponding to the selected input values as output data by conducting simulation using the selected input values as input data; and conducting a model fitting operation to determine the correlation functions representing the quantitative relations between the selected input values and the values of the characteristic parameters extracted as the output data.

Selecting the input values can be carried out utilizing at least one design of experiment (DOE) technique comprising D-optimal design, full factorial design, fractional factorial design, central composite design, and Box-Behnken design.

The model fitting operation can be carried out with using a response surface modeling (RSM) technique.

Obtaining the inverse functions of the correlation functions can comprise: obtaining a Jacobian matrix represented as partial derivatives of the processing parameters relative to the characteristic parameters; obtaining a pseudo-inverse matrix of the Jacobian matrix; and obtaining the inverse functions of the correlation functions that represent the processing parameters by transforming the product parameters into the characteristic parameters using the pseudo-inverse matrix of the Jacobian matrix.

Estimating the statistical characteristics of the processing parameters can comprise: obtaining k number of estimated product parameters by substituting the k-numbered measured data of the characteristic parameters into the following equation: $x=x_0+IJ(y-y_0)$, where x denotes a matrix of the processing parameters; $x_0$ denotes a matrix of the design values of the processing parameters, $y_0$ denotes a matrix of the design values of the electrical parameters; y denotes a matrix of the characteristic parameters; and IJ denotes an inverse matrix of the Jacobian matrix.

Estimating the statistical characteristics of the processing parameters can comprise: extracting distribution data of the processing parameters, in correspondence with the measured data, by substituting the measured data of the characteristic parameters into the inverse functions of the correlation functions; and extracting statistical distribution characteristics, which comprise mean values, dispersions, and standard deviations, of the processing parameters, from the extracted distribution data of the processing parameters.

After extracting the statistical distribution characteristics of the processing parameters, the method can further comprise: conducting a simulation using the statistical distribution characteristics of the processing parameters as input data to estimate characteristics of the semiconductor device, wherein the statistical distribution characteristics of the processing parameters are obtained from the measure data of the characteristic parameters.

BRIEF DESCRIPTION OF THE FIGURES

Non-limiting and non-exhaustive embodiments depicting aspects of the present invention will be described with reference to the following figures, wherein like reference numerals refer to like parts throughout the various figures unless otherwise specified. In the figures:

FIG. 1 is a flowchart of a prior approach for estimating characteristics of product parameters;

FIG. 2 is a flowchart illustrating an embodiment of a method generalized for establishing statistical distribution characteristics of product parameters in accordance with aspects of the present invention;

DETAILED DESCRIPTION OF PREFERRED EMBODIMENTS

Preferred embodiments will be described below with reference to the accompanying drawings. The present invention can, however, be embodied in different forms and should not be constructed as limited to the embodiments set forth herein.

FIG. 2 is a flow chart illustrating an embodiment of a method for establishing statistical distribution characteristics of product parameters in accordance with aspects of the present invention.

Referring to FIG. 2, after selecting a product to be analyzed, product parameters $x_i$ (i=1, 2, . . . , n) are established (in S10). In this embodiment, for illustrative purposes, it will be presumed that the product is a semiconductor integrated circuit, but the product is not restricted to a semiconductor integrated circuit. Namely, the present invention is generally adaptable to estimating statistical distribution characteristics of parameters for various products. Additionally, the method of estimating statistical distribution characteristics according to aspects of the present invention can be used in analyzing a correlation between design patterns and characteristics of products, and a correlation between manufacturing processes and characteristics of products. With these points, the product parameters can be design conditions applied in designing the product and processing conditions applied in fabricating the product. An illustrative embodiment for analyzing a correlation between the design conditions and the characteristics will be described again with reference to results of certain experiments hereinbelow.

According to the method characteristic parameters $y_j$ (j=1, 2, . . . , m) are established in relation to the product parameters $x_i$ (in S20). The characteristic parameters $y_j$ are selected with items representing characteristics of products fabricated on the basis of the product parameters $x_i$. At this point, the product parameters and characteristic parameters, $x_i$ and $y_j$, can be referred to as independent and dependent parameters, respectively.

The method then establishes correlation functions defining quantitative relations between the product parameters and characteristic parameters $x_i$ and $y_j$ (in S30). Considering mutual dependence between the product and characteristic parameters $x_i$ and $y_j$, the correlation functions can be equations representing the characteristic parameters $y_j$ in a function of the product parameters $x_i$ (e.g., $y_j=g_j(x_i)$; i=1, . . . n and j=1, . . . m). Here, considering that the correlation functions are represented in the form of an equation, the product and characteristic parameters, $x_i$ and $y_j$, should be selected with parameters capable of implementing a quantitative analysis.

Figure 3:
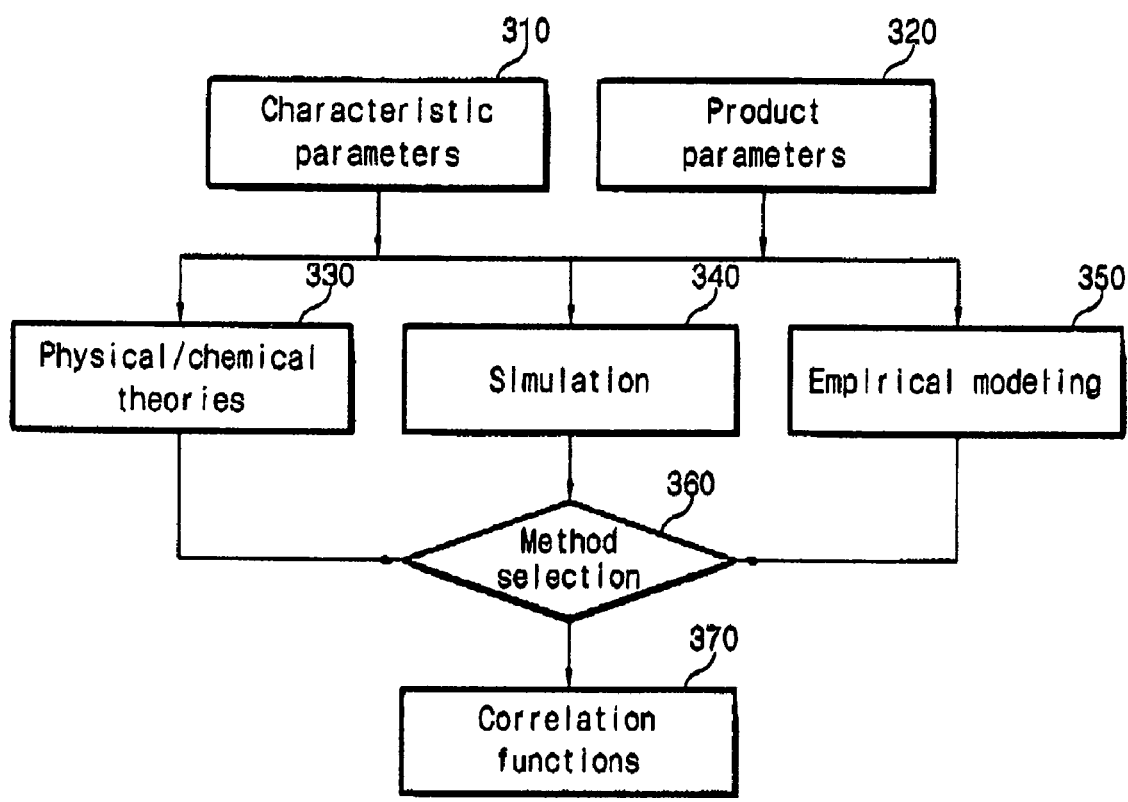
FIG. 3 is a flowchart illustrating an embodiment of a method generalized for establishing correlation functions in accordance with aspects of the present invention.

The correlation functions can be defined in various manners. For instance, FIG. 3 shows an embodiment of a method that can be used to obtain equations for correlation functions 370, which define quantitative relations between the characteristic 310 and product parameters 320, through at least one of a theoretical approach 330 based on physics and chemistry, a simulation 340, and empirical modeling 350. In the prior art it has been very difficult to achieve the desired definition of correlation functions through such theoretical approaches. But such difficulties are overcome by approaching this matter selectively using simulation and empirical modeling techniques along with the theoretical operation, represented in decision box 360. The simulation 340 and empirical modeling 350 techniques are preferably carried out for correlating the product 310 and characteristic parameters 320 with each other in a selected range (i.e., around a predetermined design value), which will be described again in detail hereinafter.

Returning to the method of FIG. 2, inverse functions of the correlation functions are obtained, representing the product parameters as a function of the characteristic parameters (in S40). As the correlation functions are multi-variable functions formed of the product parameters, it is generally not easy to obtain the inverse functions. But, the method of estimating statistical distribution characteristics in accordance with aspects of the present invention comprises steps for obtaining a Jacobian matrix represented in the form of a partial derivative of the product parameters relative to the characteristic parameters, and further includes obtaining a pseudo-inverse matrix of the Jacobian matrix. Accordingly, the method can be utilized to effectively obtain the inverse function. This method will be further detailed with reference to FIG. 6.

Figure 4:
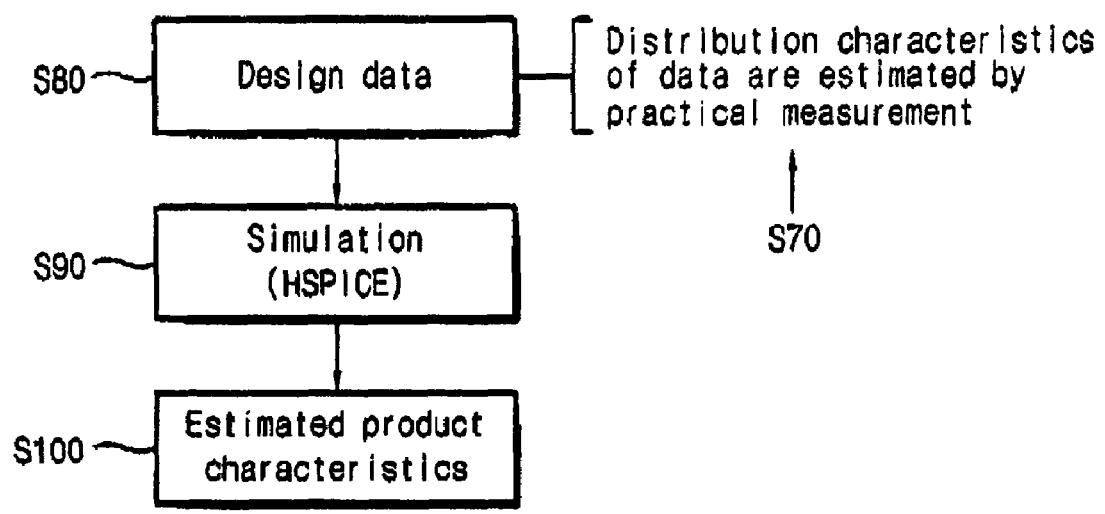
FIG. 4 is a flowchart illustrating an embodiment of a method of estimating characteristics of products in accordance with aspects of the present invention.

Using the inverse functions of the correlation functions, the method estimates distribution characteristics of the product parameters (in S70). The estimated distribution characteristics of the product parameters (in S80), as shown in FIG. 4, are used as input data for simulation (in S90) to estimate product characteristics and statistical distribution thereof (in S100). Here, the estimated distribution characteristics of the product parameters can be obtained from data evaluated by practically measuring test products fabricated on the basis of the product parameters. For this operation, the method comprises steps for fabricating the test products with reference to the product parameters (in S50) and measuring characteristics of the test products (in S60).

Figure 5:
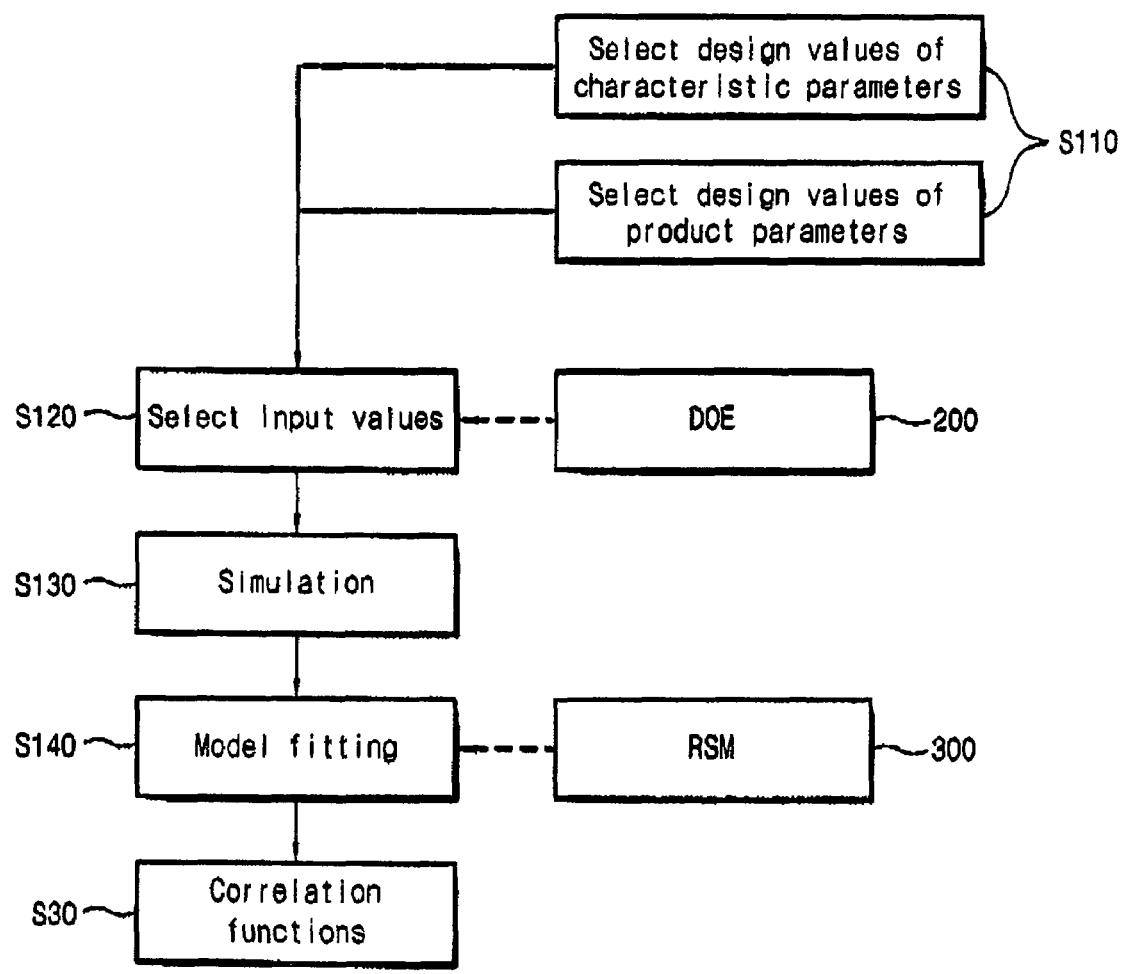
FIG. 5 is a flowchart illustrating an embodiment of a method of establishing correlation functions in accordance with aspects of the present invention.

FIG. 5 is a flowchart illustrating an embodiment of a method for establishing the correlation functions in accordance with the present invention.

Referring to FIG. 5, first, predetermined design values relative to the product parameters and the characteristic parameters are selected (in S110). In the case of a semiconductor integrated circuit, the procedure of selecting such design values can include selecting 0.06 μm for a channel length $L_{ch}$ of a transistor and selecting 0.5V for a threshold voltage $V_{th}$ of the transistor. In these embodiments, the channel length corresponds to one of the product parameters because it expresses a structural characteristic of the transistor. Also, the threshold voltage corresponds to another one of the product parameters because it expresses a structural characteristic of the transistor. Further, as the selected dimensions, i.e., $L_{ch}$=0.06 μm and $V_{th}$=0.5V, are arranged to satisfy characteristics required for the semiconductor integrated circuit, they are actual 'design values'.

Returning to FIG. 5, a plurality of simulation input values are selected around the design values of the product parameters (in S120). According to this embodiment, the simulation input values can be selected through "Design of Experiment" (DOE), a method that is well known in this field (in 200). For instance, the DOE can comprise one or more well-known techniques such as D-optimal design, full factorial design, fractional factorial design, central composite design, and Box-Behnken, as examples. As the simulation input values are selected around the design values of the product parameters, they express permissible variations on the process in fabricating the products. Subsequently, an operation of simulation is carried out to analyze quantitative correlations between the product parameters and characteristic parameters, with reference to the selected input values (in S130), resulting in output values of the simulation.

These output values of the simulation are used in a model fitting process (in S140) for obtaining the correlation functions representing quantitative correlations between the input and output values. According to the present embodiment, the model fitting process S140 can employ response surface modeling (RSM) in 300, as an example. As the correlation functions obtained from the aforementioned procedure result from the simulation in S130 with values around the input values thereof, they express variations of the characteristic parameters, relative to the design values, which correspond to fluctuations of the product parameters generated during a fabrication process of the products.

Figure 6:
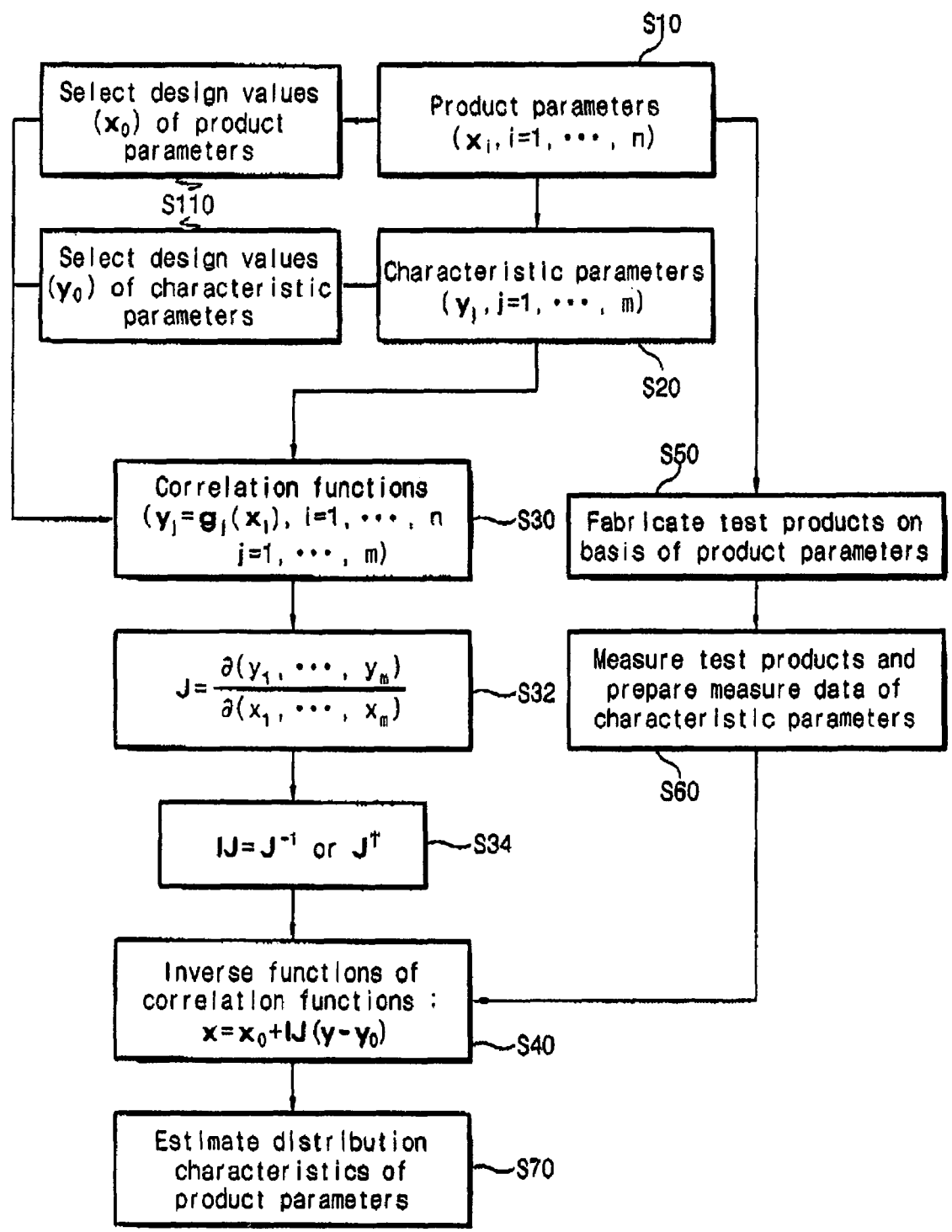
FIG. 6 is a flowchart illustrating an embodiment of a method of estimating statistical distribution characteristics of product parameters in accordance with aspects of the present invention.

FIG. 6 is a flowchart illustrating an embodiment of a method of estimating statistical distribution characteristics of product parameters, in further detail, according to aspects of the present invention. Now described is a method of estimating the inverse functions of the correlation functions and the distribution characteristics of the product parameters using the inverse functions, with reference to FIG. 6.

Referring to FIG. 6, as aforementioned, the method includes obtaining the correlation functions defining relations between the product and characteristic parameters (in S30). These correlation functions can be defined as follows.

$$y_1 = g_1(x_1, x_2, \ldots, x_n) \\ \vdots \\ y_m = g_m(x_1, x_2, \ldots, x_n)$$ [Equation 1]

Here, as aforementioned with reference to FIG. 5, these correlation functions can be obtained by way of simulation with peripheral values around the design values of the product parameters.

A Jacobian matrix is obtained that is defined as a partial derivative of the product parameters to the characteristic parameters (in S32). This Jacobian matrix can be given as follows.

$$J = \frac{\partial(y_1, \ldots, y_m)}{\partial(x_1, \ldots, x_n)}$$ [Equation 2]

Since the Jacobian matrix depends on the product parameters relative to the characteristic parameters, the Jacobian matrix can be generally obtained from the dependence among the parameters. As a result, the this embodiment is useful even in the case that it is difficult to extract the correlation functions.

According to the method, the inverse or pseudo-inverse matrix of the Jacobian matrix (S34) is obtained. As a general matter, if there is a matrix B satisfying the following matrix equation for a predetermined square matrix A, the matrix B is the inverse matrix of the matrix A.

$$AB=BA=I(I: \text{identity matrix})$$ [Equation 3]

But if the matrix A is not a square matrix, its inverse matrix cannot be generally determined. However, a pseudo-inverse matrix can be defined as a generalized form of an inverse matrix. That is, if a predetermined m×n matrix A is a kind of skinny matrix (i.e., m≧n) of a full rank type, its pseudo-inverse matrix $A^\dagger$ is given as follows.

$$A^\dagger = (A^T A)^{-1} A^T$$ [Equation 4]

Here, $A^T$ represents a transpose matrix of the matrix A and $(A^T A)^{-1}$ represents the inverse matrix of the matrix $(A^T A)$.

Further, if a predetermined m×n matrix A is a kind of fat matrix (i.e., m≦n) of a full rank type, its pseudo-inverse matrix $A^\dagger$ is given as follows.

$$A^\dagger = A^T (A A^T)^{-1}$$ [Equation 5]

Referring to the inverse or pseudo-inverse matrix of the Jacobian matrix, referred to as IJ, the method includes obtaining linear equations representing the product parameters $x_i$ with the characteristic parameters $y_j$ (in S40). Namely, assuming that a matrix representing design values of the product parameters is $x_0$ and a matrix representing design values of the characteristic parameters is $y_0$, the matrix x of the product parameters can be transformed into the matrix y of the characteristic parameters by using the inverse or pseudo-inverse matrix IJ of the Jacobian matrix, as shown in the following equation.

$$x = x_0 + IJ(y - y_0)$$ [Equation 6]

Thereafter, the test products are fabricated with reference to the product parameters (in S50). Namely, the test products are manufactured by using the design values of the product parameters of the design data. Then, data is measured from k number of the test products, so as to take measured data for characteristics of the test products (in S60). As a result, the measured data are formed of k×n values. These measured data correspond with the characteristic parameters. Distribution characteristic data of the product parameters are extracted by applying the measured data into the matrix y of Equation 6. In accordance with aspects of the present invention, the extracted distribution characteristic data of the product parameters are obtained from the practical measured data. Then, statistical distribution characteristics of the product parameters, comprising one or more of mean values, dispersion values, and standard deviations, are extracted using statistical analysis with the distribution characteristic data.

Such statistical distribution characteristics of the product parameters are reused as input data (in S80) for estimating characteristics of the product, as shown in FIG. 4, as discussed above. Here, it can be understood that while the conventional case regards the distribution characteristics of the product parameters as being normalized, the present embodiment utilizes the statistical distribution characteristics of the product parameters that are extracted from the practical measure data. The estimation for product characteristics comprises distributional features thereof, examined empirically. Further, the estimation for product characteristics, according to aspects of the present invention, is able to provide more evolved accuracy than the conventional approach. This advanced accuracy in estimating the product characteristics (in S100), according to aspect of the present invention, will be explained with respect to FIGS. 7 to 10 showing embodiments practiced in the context of semiconductor integrated circuits.

The methodology for estimating product parameters in accordance with aspects of the present invention is applicable to analyzing correlations between design conditions and electrical characteristics of semiconductor integrated circuits. As a result, in these embodiments, the product parameters correspond with the design conditions defining physical/structural characteristics of the semiconductor integrated circuits. In detail, as the semiconductor integrated circuit is generally comprised of transistors, resistive elements, interconnections linking them together, and insulative constructions disposed among them, the product parameters can be selected to represent physical characteristics of at least one of the structural components. For instance, the product parameter can be at least one of physical characteristics comprising channel length, channel width, thickness of gate insulation film, impurity concentration of gate electrode, conductance of gate electrode, impurity concentration of the channel, depth of the source/drain region, zero-bias threshold voltage, and so forth.

Additionally, the characteristic parameters can be characteristics that are electrically measurable from the semiconductor integrated circuit, depending on the product parameters. For example, the characteristic parameter can be at least one of electrical characteristics comprising drain-to-source current, off-current, threshold voltage, breakdown voltage of gate insulation film, breakdown and punch-through voltages of source/drain junction, and so forth. But, the product and characteristic parameters can be selected with various items, without being restrictive to the exemplarily physical and electrical characteristics mentioned above.

The method for estimating statistical distribution characteristics, according to aspects of the present invention, was experimentally applied to a single NMOS device fabricated by means of a 68-nm processing technique. In this exemplary experiment, the product parameters for estimation were selected for the effective channel length $L_{eff}$, the oxide thickness $T_{ox}$, and the zero-bias threshold voltage $V_{th0}$, while the characteristic parameters to be measured were selected in the drain-source current $I_{ds}$, the off-current $I_{off}$, and the threshold voltage $V_{th}$. Therefore, the product and characteristic parameters can be summarized in vector components as follows.

$$x = \begin{bmatrix} L_{eff} \\ T_{ox} \\ V_{th0} \end{bmatrix} \text{ and } y = \begin{bmatrix} I_{ds} \\ \log I_{off} \\ V_{th} \end{bmatrix} \quad \text{[Equation 7]}$$

In Equation 7, as the off-current $I_{off}$ is exponentially dependent on the parameters $L_{eff}$, $T_{ox}$, and $V_{th0}$, it is represented in the form of a logarithm for easy estimation. Here, the correlation functions representing the quantitative relations among the parameters can be obtained by the methods aforementioned with reference to FIGS. 3, 5, and 6, and the inverse functions thereof can be obtained by the method shown in FIG. 6.

Figure 7:
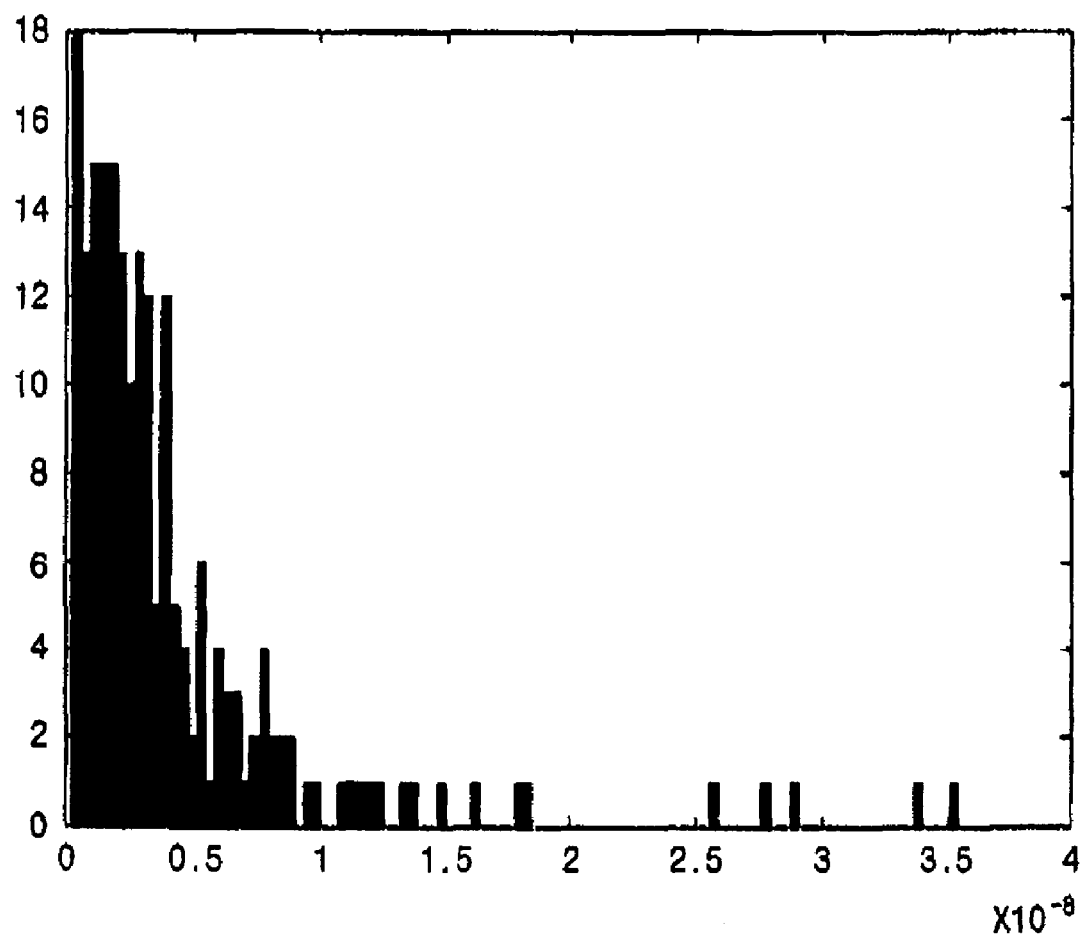
FIG. 7 is a histogram exemplarily showing distribution characteristics of an off-current $I_{off}$ resulting from the embodiments above.
Figure 8:
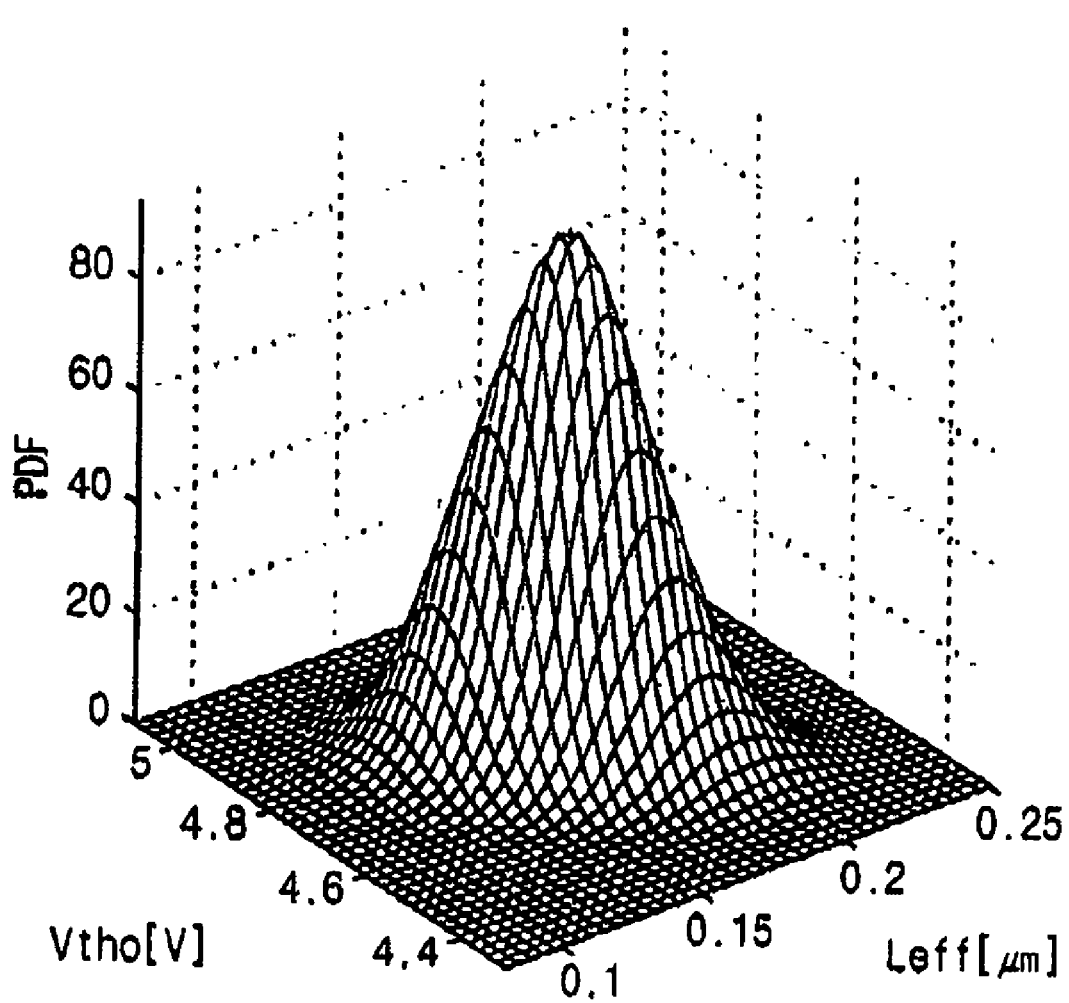
FIGS. 8 and 9 are a three-dimensional graph and a contour plot chart, those of which show features of joint probability density function resulting from the embodiment of the present invention.
Figure 9:
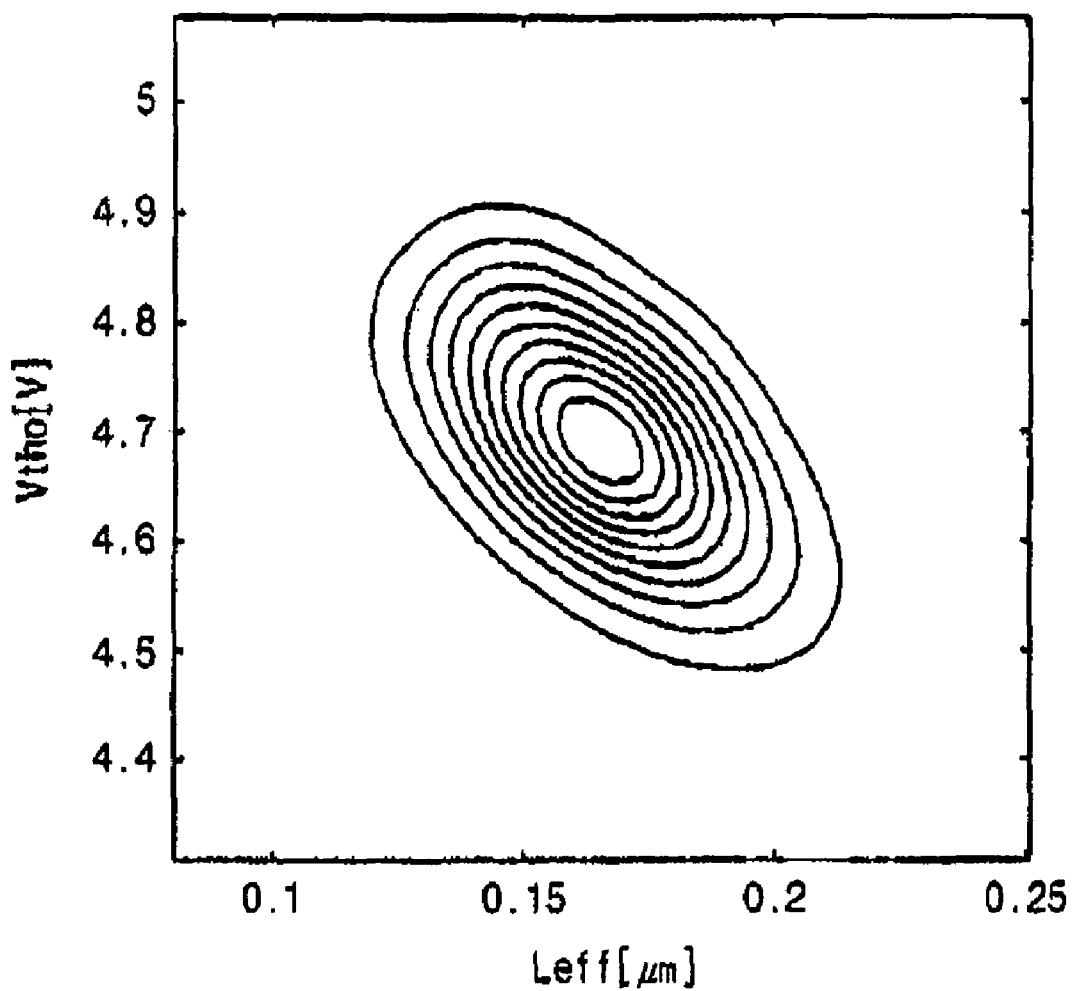

Then, after fabricating an NMOS device with the dimensions of W/L=2.64 μm/0.17 μm for the product parameters, $I_{ds}$, $d_{off}$, and $V_{th}$ are measured from the NMOS device, which was done 500 times. The NMOS device was fabricated by means of the 68-nm processing technique. And, using the method shown in FIG. 6, it analyzed distribution characteristics of the measured characteristic parameters. FIG. 7 is a histogram exemplarily showing the distribution characteristics of the off-current $I_{off}$ obtained by measuring the NMOS device.

Thereafter, the statistical characteristics are estimated, such as mean values and standard deviations of $L_{eff}$, $T_{ox}$, and $V_{th0}$, using statistical analysis. Hereinafter, Tables 1 and 2, and FIGS. 8 and 9 will show results of such estimation.

TABLE 1

|  | Design value | Mean | Standard deviation | Standard deviation/ Average |
|---|---|---|---|---|
| $L_{eff}$ [μm] | 0.17 | 0.1655 | 0.0170 | 10.02% |
| $T_{ox}$ [nm] | 1.0 | 1.0840 | 0.1554 | 15.54% |
| $V_{th0}$ [V] | 4.7 | 4.6930 | 0.0768 | 1.63% |

Table 1 shows, as an example, mean values and standard deviations of $L_{eff}$, $T_{ox}$, and $V_{th0}$. According to Table 1, while $V_{th0}$ is relatively small in variation, $T_{ox}$ is considerably larger in variation. Therefore, the methodology in accordance with aspects of the present invention is able to analyze correlations among the parameters, as well as estimating variations of the parameters.

TABLE 2

|  | $L_{eff}$ | $T_{ox}$ | $V_{th0}$ |
|---|---|---|---|
| $L_{eff}$ | 1 | 0.6024 | −0.8361 |
| $T_{ox}$ | 0.6024 | 1 | −0.6026 |
| $V_{th0}$ | −0.8361 | −0.6026 | 1 |

Table 2 represents correlative degrees among the design parameters $L_{eff}$, $T_{ox}$, and $V_{th0}$. Referring to Table 2, the parameters $L_{eff}$ and $V_{th0}$ are strongly correlated with each other in negative proportions. In other words, if the parameter $L_{eff}$ increases, it raises the probability of reducing the parameter $V_{th0}$ in value. The reverse is also true. These features of the correlations can be seen from the three-dimensional graph and contour plot, each depicted in FIGS. 8 and 9, which show the pattern of joint probability density functions between the parameters $L_{eff}$ and $V_{th0}$.

Next, to obtain the electrical characteristics (i.e., $I_{ds}$, $I_{off}$, and $V_{th}$), a first simulation was carried out with the statistical distribution characteristics of the design parameters that are generated from the measured data (refer to FIG. 4). The first simulation was executed by means of the "Monte Carlo" technique. Additionally, without considering correlations among the parameters, second simulation was carried out in the same manner. Table 3 hereinafter shows results of the first and second simulation processes.

TABLE 3

| Mean | $\mu_M$ | $(\mu_S - \mu_M)/\mu_M$ | $(\mu_{iS} - \mu_M)/\mu_M$ |
|---|---|---|---|
| $I_{ds}$ [mA] | 0.9204 | 1.25% | 1.78% |
| log $I_{off}$ | −19.8001 | −0.21% | −0.10% |
| $V_{th}$ [V] | 0.4925 | −0.07% | 0.23% |
| Standard deviation | $\sigma_{iS}$ | $\sigma_S/\sigma_M$ | $\sigma_{iS}/\sigma_M$ |
| $I_{ds}$ [mA] | 0.0983 | 1.0782 | 1.9526 |
| log $I_{off}$ | 1.0368 | 0.9949 | 2.0288 |
| $V_{th}$ [V] | 0.0523 | 1.0818 | 1.8065 |

Here, $\mu_M$, $\mu_S$, and $\mu_{iS}$ represent mean values of the measured values, and the first and second simulations, respectively, while $\sigma_M$, $\sigma_S$, and $\sigma_{iS}$ represent standard deviations of the measured values, and the first and second simulations.

Figure 10A:
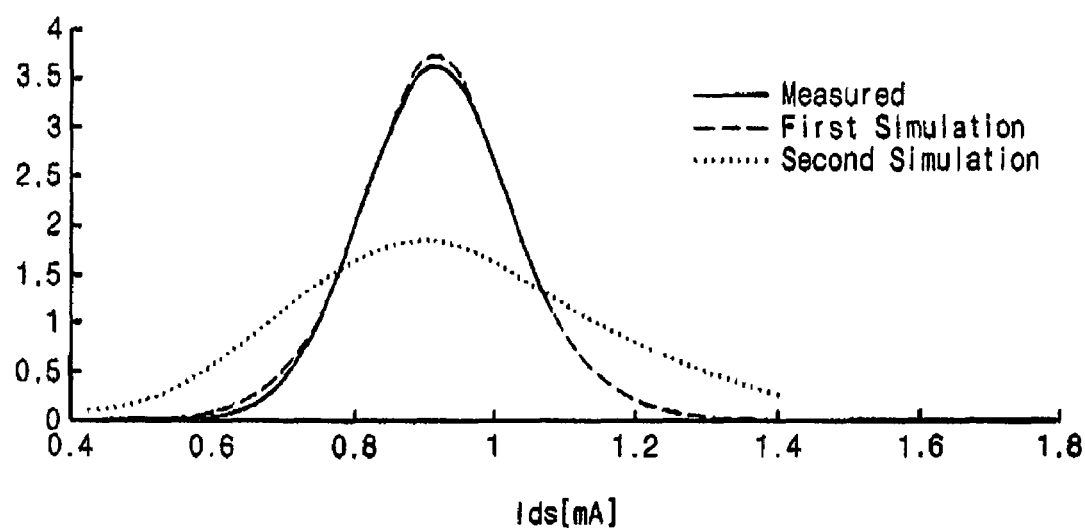
FIGS. 10A, 10B, and 10C are graphs show features of joint probability density functions with characteristic parameters, $I_{ds}$, $I_{off}$, and $V_{th}$, resulting from the embodiment of the present invention.
Figure 10B:
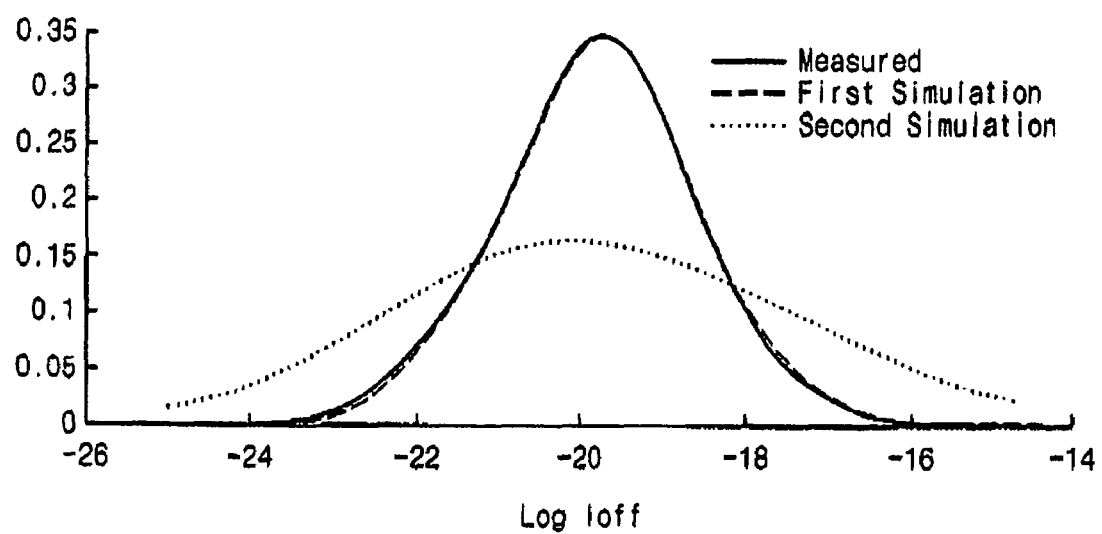
Figure 10C:
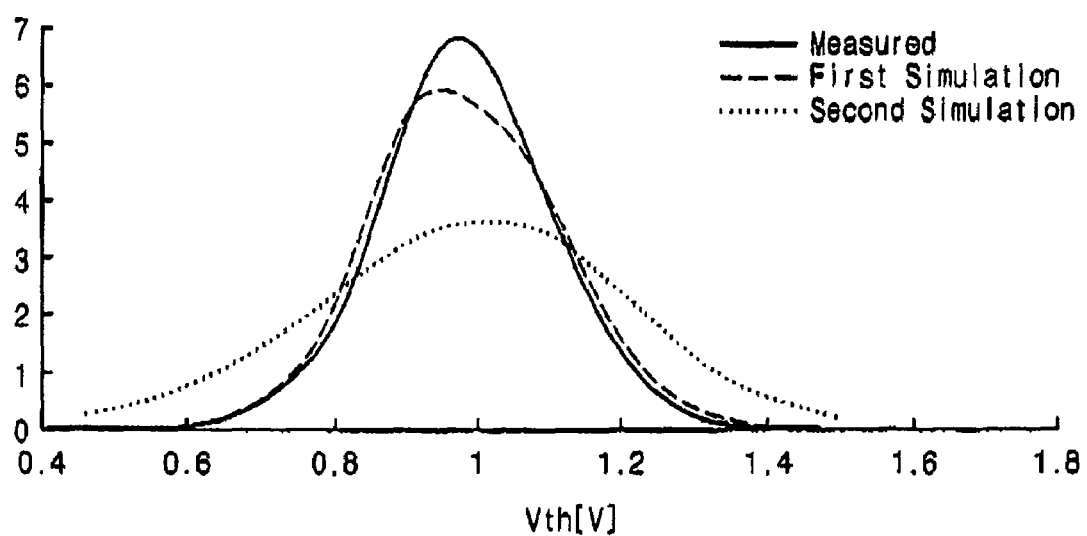

Referring to Table 3, errors between the mean values of the first and second simulations were less than 2% thereof. Considering correlations of the parameters, the standard deviations of the first simulation were near to those of measured values of the parameters ($\sigma_S/\sigma_M \sim 1$). Otherwise, without considering correlations of the parameters, the standard deviations of the first simulation were much different from those of measured values of the parameters ($\sigma_S/\sigma_M \sim 2$). From these results, it can be understood that there is a need for considering the correlations of the parameters. This necessity for the correlations of the parameters becomes more apparent through FIGS. 10A through 10C depicting the joint probability density functions in the second dimensions. FIGS. 10A, 10B, and 10C are graphs showing features of the probability density functions with the characteristic parameters, $I_{ds}$, $I_{off}$, and $V_{th}$, resulting from the embodiments above.

Referring to FIGS. 10A through 10C, while there is a remarkable gap in the probability density functions between the values of the second simulation and the practical measured values, the probability density functions between the values of the first simulation and the measured values are approximate to each other. Such a difference between the first and second simulations arises from correlations of the parameters, showing the necessity for considering the correlations of the parameters. For this reason, a methodology for enabling the analysis of the correlations of the parameters, according to aspects of the present invention, is helpful in improving the performance of estimating product characteristics.

Consequently, the methodology is advantageous for providing useful results, even for the probability density functions and the joint probability density functions, as well as the statistical characteristics such as the mean values and standard deviations.

The methodology, as aforementioned, is also applicable to analyzing correlations among the characteristics of the semiconductor device fabricated by referring to the processing conditions and parameters of the semiconductor integrated circuit. In this embodiment, the product parameters correspond with the processing conditions applied to the procedure of manufacturing the semiconductor integrated circuit. In detail, the product parameters can be at least one of the processing conditions, such as temperature, duration, pressure, gas flux, relative compound ratio of processing gases, and so forth, those of which are applied to at least one of the processing steps for fabricating transistors, resistive elements, interconnections, and insulative constructions.

Further, the characteristic parameters can be items measurable quantitatively, depending on the product parameters. For instance, the characteristic parameter can be one of the characteristics related to the processing conditions, such film thickness, film density, film permittivity, film conductivity, pattern width, tilt angle of pattern sidewall, etching selection ratio, etching rate, deposition rate, and step coverage, for the semiconductor device fabricated with reference to the processing conditions. But, the product and characteristic parameters can be variously selected in accordance with necessities of the device, without being restrictive to the exemplary processing conditions and characteristic items herein.

In this embodiment, methods for obtaining the correlation functions and their inverse functions, and methods for extracting the statistical distribution characteristics of the product parameters therewith can be carried out in the same manners as used in the above embodiments, so will not be described in further detail.

In summary, in accordance with aspects of the present invention, provided is a methodology generalized for estimating and analyzing the correlations among the product parameters, which defines a feature of a product, and the characteristic parameters obtained from the product parameters. For this, the methodology comprises a step of, after generating correlation functions that represent the characteristic parameters in the form of the product parameters, obtaining the inverse functions of the correlation functions. The inverse functions of the correlation functions can be obtained by way of generating the Jacobian matrix and the inverse matrix thereof. Using the inverse functions of the correlation functions, results measured from the test products fabricated with reference to the product parameters are statistically analyzed to extract data for the statistical distribution characteristics of the product parameters. As the extracted data are based on values measured from a fabricated product, aspects of the present invention are available for: (1) analyzing characteristics of the product, which immediately reflect errors and variations on process; and further (2) analyzing physical meanings of data (i.e., correlations among the parameters) different from the conventional case.

Moreover, according to aspects of the present invention, analysis of the parameters correctly and quickly is provided. Namely, as aforementioned, since the items practically measured can be easily obtained by way of electrical means, the time it takes for measurement is shorter. While the conventional case is needed to conduct a dissipative process to solve nonlinear equations for such an analysis, in accordance with aspects of the present invention, an operation time for obtaining the results of analysis is significantly shortened, because it is based on a simpler procedure for executing multiplications of matrices. As an example, in the case of analyzing the product and characteristic parameters each in of 10 instances, while the conventional method for solving the nonlinear equations would take several days to obtain results of analysis, in accordance with aspects of the present invention the desired results of analysis are obtained in about one second. Specifically, in accordance with aspects of the present invention, generation of effective results of analysis are achieved through the method of obtaining the pseudo-inverse matrices, thereby offering highly generalized methodology applicable to varieties of industrial applications.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for estimating distribution characteristics of product parameters, the method comprising:
   determining n number of product parameters that characterize a product;
   determining m number of characteristic parameters dependent on the product parameters;
   determining m number of correlation functions that represent the characteristic parameters in terms of the product parameters;
   obtaining inverse functions of the correlation functions that represent the product parameters in terms of the characteristic parameters;
   fabricating test products to empirically determine quantitative relations between the product parameters and characteristic parameters;
   obtaining k numbered measured data of the characteristic parameters by measuring k number of the test products; and
   estimating statistical characteristics of the product parameters corresponding to a distribution of the measured data of the characteristic parameters using the inverse functions of the correlation functions.

2. The method as set forth in claim 1, wherein the product parameters are physical parameters representing physical characteristics of the products, processing conditions for fabricating the product, or both,
   wherein the characteristic parameters are measurable parameters dependent on the product parameters.

3. The method as set forth in claim 1, wherein the correlation functions are determined using at least one of physical/chemical theories, a simulation technique, and a modeling technique based on empirical data.

4. The method as set forth in claim 1, wherein determining the correlation functions comprises:
   determining design values of the characteristic parameters and product parameters for satisfying required qualities of the product; and
   obtaining the correlation functions to fit the design values of the characteristic parameters and the design values of the product parameters.

5. The method as set forth in claim 4, wherein determining the correlation functions comprises:
   selecting different input values in a predetermined number around the design values of the product parameters;
   extracting values of the characteristic parameters corresponding to the selected input values as output data, by conducting simulation using the selected input values as input data; and
   conducting a model fitting operation to determine the correlation functions representing the quantitative relations between the selected input values and the values of the characteristic parameters extracted as the output data.

6. The method as set forth in claim 5, wherein selecting the input values comprises utilizing at least one design of experiment (DOE) technique comprising D-optimal design, full factorial design, fractional factorial design, central composite design, and Box-Behnken design.

7. The method as set forth in claim 5, wherein the model fitting operation comprises using a response surface modeling (RSM) technique.

8. The method as set forth in claim 4, wherein obtaining the inverse functions of the correlation functions comprises:
   obtaining a Jacobian matrix represented as partial derivatives of the product parameters relative to the characteristic parameters;
   obtaining a pseudo-inverse matrix of the Jacobian matrix; and
   obtaining the inverse functions of the correlation functions that represent the product parameters by transforming the product parameters into the characteristic parameters using the pseudo-inverse matrix of the Jacobian matrix.

9. The method as set forth in claim 8, wherein estimating the statistical characteristics of the product parameters comprises:
   obtaining k number of estimated product parameters by substituting the k-numbered measured data of the characteristic of the product parameters into the following equation:

$$x = x_0 + IJ(y - y_0),$$

where x denotes a matrix of the product parameters; $x_0$ denotes a matrix of the design values of the product parameters; $y_0$ denotes a matrix of the design values of the characteristic parameters; y denotes a matrix of the characteristic parameters; and IJ denotes an inverse matrix of the Jacobian matrix.

10. The method as set forth in claim 1, wherein estimating the statistical characteristics of the product parameters comprises:
    extracting distribution data of the product parameters corresponding to the measured data by applying the measured data of the characteristic parameters into the inverse functions of the correlation functions; and
    extracting statistical distribution characteristics, which comprise mean values, dispersions, and standard deviations, of the product parameters, from the extracted distribution data of the product parameters.

11. The method as set forth in claim 10, after extracting the statistical distribution characteristics of the product parameters, the method further comprising:
    conducting a simulation using the statistical distribution characteristics of the product parameters as input data to estimate characteristics of the product,
    wherein the statistical distribution characteristics of the product parameters are obtained from the measured data of the characteristic parameters.

12. A method for estimating physical parameters of a semiconductor device, the method comprising:

determining n number of physical parameters to characterize the semiconductor device;
determining m number of electrical parameters dependent on the physical parameters;
determining m number of correlation functions that represent the electrical parameters in terms of the physical parameters;
obtaining inverse functions of the correlation functions that represent the physical parameters in terms of the electrical parameters;
fabricating test devices to empirically determine quantitative relations between the physical parameters and electrical parameters;
obtaining k numbered measured data of the electrical parameters by measuring k number of the test devices; and
estimating statistical characteristics of the physical parameters corresponding to a distribution of the measured data of the electrical parameters using the inverse functions of the correlation functions.

13. The method as set forth in claim 12, wherein the semiconductor device comprises at least one or transistors, resistive elements, interconnections coupling the transistors and/or resistive elements, and insulating constructions disposed around the transistors, the resistive elements, and the interconnections,
wherein the physical parameters are parameters representing physical characteristics of at least one of the transistors, the resistive elements, the interconnections, and the insulating constructions,
wherein the electrical parameters are parameters electrically measurable and dependent on the physical parameters.

14. The method as set forth in claim 13, wherein the physical parameters comprise at least one physical characteristic of the transistor comprising channel length, channel width, thickness of gate insulation film, thickness of gate electrode, impurity concentration of gate electrode, conductance of gate electrode, impurity concentration of channel, depth of source/drain region, and zero-bias threshold voltage, and
wherein the electrical parameters comprises at least one electrical characteristic of the transistor comprising source/drain current, off-current, threshold voltage, breakdown voltage of gate insulation film, breakdown voltage of source/drain junction, and punch-through voltage.

15. The method as set forth in claim 12, wherein the correlation functions are determined using at least one of physical/chemical theories, a simulation technique, and a modeling technique based on empirical data.

16. The method as set forth in claim 12, wherein determining the correlation functions comprises:
determining design values of the electrical parameters and physical parameters for satisfying required qualities of the semiconductor device; and
obtaining the correlation functions to fit the design values of the electrical parameters and the design values of the physical parameters.

17. The method as set forth in claim 16, wherein determining the correlation functions comprises:
selecting different input values in a predetermined number around the design values of the physical parameters;
extracting values of the electrical parameters corresponding to the selected input values as output data, by conducting simulation using the selected input values as input data; and
conducting a model fitting operation to determine the correlation functions representing the quantitative relations between the selected input values and the values of the electrical parameters extracted as the output data.

18. The method as set forth in claim 17, wherein selecting the input values comprises utilizing at least one design of experiment (DOE) technique comprising D-optimal design, full factorial design, fractional factorial design, central composite design, and Box-Behnken design.

19. The method as set forth in claim 17, wherein the model fitting operation comprises using a response surface modeling (RSM) technique.

20. The method as set forth in claim 16, wherein obtaining the inverse functions of the correlation functions comprises:
obtaining a Jacobian matrix represented as partial derivatives of the physical parameters relative to the electrical parameters;
obtaining a pseudo-inverse matrix of the Jacobian matrix; and
obtaining the inverse functions of the correlation functions that represent the physical parameters by transforming the product parameters into the electrical parameters using the pseudo-inverse matrix of the Jacobian matrix.

21. The method as set forth in claim 20, wherein estimating the statistical characteristics of the physical parameters comprises:
obtaining k-numbered estimated physical parameters by substituting the k-numbered measured data of the electrical parameters into the following equation:

$$x=x_0+IJ(y-y_0),$$

where x denotes a matrix of the physical parameters; $x_0$ denote a matrix of the design values of the physical parameters; $y_0$ denote a matrix of the design values of the electrical parameters; y denotes a matrix of the electrical parameters; and IJ denotes an inverse matrix of the Jacobian matrix.

22. The method as set forth in claim 12, wherein estimating the statistical characteristics of the physical parameters comprises:
extracting distribution data of the physical parameters, in correspondence with the measured data, by substituting the measured data of the electrical parameters into the inverse functions of the correlation functions; and
extracting statistical distribution characteristics, which comprise mean values, dispersions, and standard deviations, of the physical parameters, from the extracted distribution data of the physical parameters.

23. The method as set forth in claim 22, after extracting the statistical distribution characteristics of the physical parameters, the method further comprising:
conducting a simulation using the statistical distribution characteristics of the physical parameters as input data to estimate characteristics of the semiconductor device,
wherein the statistical distribution characteristics of the physical parameters are obtained from the measure data of the electrical parameters.

24. A method for estimating processing parameters of a semiconductor device, the method comprising:
determining n number of the processing parameters to characterize a fabrication process of the semiconductor device;
determining m number of characteristic parameters dependent on the processing parameters;

determining m number of correlation functions that represent the characteristic parameters in terms of the processing parameters;

obtaining inverse functions of the correlation functions that represent the processing parameters in terms of the characteristic parameters;

manufacturing test devices to empirically determine quantitative relations between the processing parameters and characteristic parameters;

obtaining k numbered measured data of the characteristic parameters by measuring k number of the test devices; and estimating statistical characteristics of the processing parameters corresponding to a distribution of the measured data of the characteristic parameters using inverse functions of the correlation functions.

25. The method as set forth in claim 24, wherein the processing parameters are processing conditions applied in the semiconductor fabrication process, wherein the characteristic parameters are measurable characteristics dependent on the processing conditions.

26. The method as set forth in claim 24, wherein the semiconductor device comprises one or more of transistors, resistive elements, interconnections coupling the transistors and/or resistive elements, and insulating constructions disposed around the transistors, the resistive elements, and the interconnections, wherein the processing parameters include at least one of the processing conditions comprising temperature, duration, pressure, gas flux, and relative compound ratio of processing gases, which are applied to at least one of steps for fabricating the transistors, the resistive elements, the interconnections, and the insulative constructions, wherein the characteristic parameters include at least one of characteristics of the semiconductor device fabricated with reference to the processing parameters comprising film thickness, film density, film permittivity, film conductivity, pattern width, tilt angle of pattern sidewall, etching selection ratio, etching rate, deposition rate, and step coverage, which is dependent on the processing conditions.

27. The method as set forth in claim 24, wherein the correlation functions are determined using at least of physical/chemical theories, a simulation technique, and a modeling technique based on empirical data.

28. The method as set forth in claim 24, wherein determining the correlation functions comprises:

determining design values of the characteristic parameters and processing parameters for satisfying required qualities of the semiconductor device; and obtaining the correlation functions to fit the design values of the characteristic parameters and the design values of the processing parameters.

29. The method as set forth in claim 28, wherein determining the correlation functions comprises:

selecting different input values in a predetermined number around the design values of the processing parameters;

extracting values of the characteristic parameters corresponding to the selected input values as output data by conducting simulation using the selected input values as input data; and conducting a model fitting operation to determine the correlation functions representing the quantitative relations between the selected input values and the values of the characteristic parameters extracted as the output data.

30. The method as set forth in claim 29, wherein selecting the input values is carried out utilizing at least one design of experiment (DOE) technique comprising D-optimal design, full factorial design, fractional factorial design, central composite design, and Box-Behnken design.

31. The method as set forth in claim 29, wherein the model fitting operation is carried out with using a response surface modeling (RSM) technique.

32. The method as set forth in claim 28, wherein obtaining the inverse functions of the correlation functions comprises:

obtaining a Jacobian matrix represented as partial derivatives of the processing parameters relative to the characteristic parameters;

obtaining a pseudo-inverse matrix of the Jacobian matrix; and obtaining the inverse functions of the correlation functions that represent the processing parameters by transforming the product parameters into the characteristic parameters using the pseudo-inverse matrix of the Jacobian matrix.

33. The method as set forth in claim 32, wherein estimating the statistical characteristics of the processing parameters comprises:

obtaining k number of estimated product parameters by substituting the k-numbered measured data of the characteristic parameters into the following equation:

$$x = x_0 + IJ(y - y_0),$$

where x denotes a matrix of the processing parameters; $x_0$ denotes a matrix of the design values of the processing parameters, $y_0$ denotes a matrix of the design values of the electrical parameters; y denotes a matrix of the characteristic parameters; and IJ denotes an inverse matrix of the Jacobian matrix.

34. The method as set forth in claim 24, wherein estimating the statistical characteristics of the processing parameters comprises:

extracting distribution data of the processing parameters, in correspondence with the measured data, by substituting the measured data of the characteristic parameters into the inverse functions of the correlation functions; and extracting statistical distribution characteristics, which comprise mean values, dispersions, and standard deviations, of the processing parameters, from the extracted distribution data of the processing parameters.

35. The method as set forth in claim 34, after extracting the statistical distribution characteristics of the processing parameters, the method further comprising:

conducting a simulation using the statistical distribution characteristics of the processing parameters as input data to estimate characteristics of the semiconductor device, wherein the statistical distribution characteristics of the processing parameters are obtained from the measure data of the characteristic parameters.

* * * * *